United States Patent
Doi et al.

(10) Patent No.: US 12,187,902 B2
(45) Date of Patent: Jan. 7, 2025

(54) POWDER AND SOLID COMPOSITION

(71) Applicant: Sumitomo Chemical Company, Limited, Tokyo (JP)

(72) Inventors: Atsunori Doi, Tsukuba (JP); Satoshi Shimano, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 451 days.

(21) Appl. No.: 17/624,957

(22) PCT Filed: Jun. 22, 2020

(86) PCT No.: PCT/JP2020/024356
§ 371 (c)(1),
(2) Date: Jan. 5, 2022

(87) PCT Pub. No.: WO2021/010096
PCT Pub. Date: Jan. 21, 2021

(65) Prior Publication Data
US 2022/0267605 A1    Aug. 25, 2022

(30) Foreign Application Priority Data
Jul. 12, 2019  (JP) .................................. 2019-130484

(51) Int. Cl.
*C09C 1/36* (2006.01)
*C01G 23/04* (2006.01)
(Continued)

(52) U.S. Cl.
CPC .............. *C09C 1/36* (2013.01); *C01G 23/043* (2013.01); *C04B 14/305* (2013.01); *C04B 28/26* (2013.01);
(Continued)

(58) Field of Classification Search
CPC ... C01G 23/043; C01G 23/08; C01P 2002/77; C01P 2004/51; C01P 2004/61;
(Continued)

(56) References Cited

U.S. PATENT DOCUMENTS

| 6,066,585 A | 5/2000 | Swartz |
| 6,251,810 B1 | 6/2001 | Siebers et al. |

(Continued)

FOREIGN PATENT DOCUMENTS

| JP | 2000095541 A | 4/2000 |
| JP | 2012056835 A | 3/2012 |

(Continued)

OTHER PUBLICATIONS

Chen et al., "Structure and negative thermal expansion in the PbTiO3—BiFeO3 system," Applied Physics Letters, vol. 89, pp. 101914-1-101914-3 (2006).

(Continued)

*Primary Examiner* — Shuangyi Abu Ali
(74) *Attorney, Agent, or Firm* — Panitch Schwarze Belisario & Nadel LLP

(57) ABSTRACT

This powder satisfies requirements 1 and 2. Requirement 1: $|dA(T)/dT|$ satisfies 10 ppm/° C. or more at at least one temperature T1 in a range of −200° C. to 1200° C. A is (a-axis (shorter axis) lattice constant) of a crystal in the powder)/(c-axis (longer axis) lattice constant of the crystal in the powder), and each of the lattice constants is obtained by X-ray diffractometry of the powder. Requirement 2: a particle diameter D50 at a cumulative frequency of 50%, a particle diameter D10 at a cumulative frequency of 10%, and a particle diameter D90 at a cumulative frequency of 90% in a volume-based cumulative particle diameter distribution curve obtained by a laser diffraction scattering method satisfy conditions (I) and (II): (I) D10/D50 is 0.05 or more (Continued)

and 0.45 or less; and (II) D90 is 0.5 μm or more and 70 μm or less.

5 Claims, 6 Drawing Sheets

(51) Int. Cl.
    *C04B 14/30*     (2006.01)
    *C04B 28/26*     (2006.01)
    *C09C 3/04*     (2006.01)

(52) U.S. Cl.
    CPC .......... *C09C 3/041* (2013.01); *C01P 2002/77* (2013.01); *C01P 2004/51* (2013.01); *C01P 2004/61* (2013.01); *C01P 2004/62* (2013.01); *C01P 2006/32* (2013.01)

(58) Field of Classification Search
    CPC .............. C01P 2004/62; C01P 2006/12; C01P 2006/32; C04B 14/305; C04B 28/26; C09C 1/0084; C09C 1/36; C09C 1/3623; C09C 3/041; Y02P 10/25; C22C 33/02; H01L 33/56
    See application file for complete search history.

(56) References Cited

U.S. PATENT DOCUMENTS

| | | |
|---|---|---|
| 2012/0058876 A1 | 3/2012 | Tae Heung et al. |
| 2014/0093686 A1* | 4/2014 | Jacobs .................. E04D 7/005 106/286.6 |
| 2018/0251376 A1 | 9/2018 | Fukazawa et al. |
| 2018/0265358 A1 | 9/2018 | Fukazawa |
| 2019/0031528 A1 | 1/2019 | Takenaka et al. |
| 2022/0005690 A1 | 1/2022 | Tanaka et al. |

FOREIGN PATENT DOCUMENTS

| | | |
|---|---|---|
| JP | 2018002577 A | 1/2018 |
| JP | 2019130447 A | 8/2019 |
| JP | 2019130451 A | 8/2019 |
| JP | 2020062573 A | 4/2020 |
| JP | 2020062580 A | 4/2020 |
| JP | 2020063973 A | 4/2020 |
| JP | 2020076150 A | 5/2020 |
| WO | 2017138643 A1 | 8/2017 |

OTHER PUBLICATIONS

Iqbal et al., "Extraordinary role of Ce—Ni elements on the electrical and magnetic properties of Sr—Ba M-type hexaferrites," Materials Research Bulletin, vol. 44, pp. 2050-2055 (2009).

Nosenko et al., "Negative Heat Expansion of Titanium Oxide (III)," Voprosy Khimii i Khimicheskoi Tekhnologii, vol. 1, pp. 87-91 (2018).

Shang et al., Effect of MgO and PVA on the Synthesis and Properties of Negative Thermal Expansion Ceramics of Zr2(WO4)(PO4)2, International Journal of Applied Ceramic Technology, vol. 10, No. 5, pp. 849-856 (2013).

Violini et al., Low (and negative) thermal expansion Al2TiO5 materials and Al2TiO5—3Al2O3.2SiO2—ZrTiO4 composite materials. Processing, initial zircon proportion effect, and properties, Ceramics International, vol. 44, pp. 21470-21477 (2018).

* cited by examiner

POWDER AND SOLID COMPOSITION

CROSS-REFERENCE TO RELATED APPLICATIONS

This application is a Section 371 of International Application No. PCT/JP2020/024356, filed Jun. 22, 2020, which was published in the Japanese language on Jan. 21, 2021, under International Publication No. WO 2021/010096 A1, which claims priority under 35 U.S.C. § 119 (b) to Japanese Application No. 2019-130484, filed Jul. 12, 2019, the disclosures of which are incorporated by reference herein.

TECHNICAL FIELD

The present invention relates to powder and a solid composition.

BACKGROUND ART

Conventionally, it has been known to add a solid material having a negative linear thermal expansion coefficient to a solid material having a positive linear thermal expansion coefficient in order to lower the linear thermal expansion coefficient of the latter solid material.

For example, Patent Document 1 discloses tungsten zirconium phosphate as a material exhibiting a negative linear thermal expansion coefficient.

PRIOR ART DOCUMENTS

Patent Documents

Patent Document 1: JP-A-2018-2577

SUMMARY OF THE INVENTION

Problems to be Solved by Invention

However, in the conventional material, the linear thermal expansion coefficient is not necessarily sufficiently lowered.

Meanwhile, a film-shaped material can be formed, for example, by applying a composition such as ink. Such a composition is required to have excellent coatability.

The present invention has been made in view of the above circumstances. The purpose of the present invention is to provide powder capable of forming a composition having excellent thermal expansion control characteristics and excellent coatability, and a solid composition using the powder.

Means for Solving the Problems

As a result of intensive research, the present inventors have arrived at the present invention. Specifically, the present invention provides the following items of the invention.

The invention provides powder that satisfies the following requirements 1 and 2.

Requirement 1: $|dA(T)/dT|$ satisfies 10 ppm/° C. or more at at least one temperature T1 in a range of −200° C. to 1200° C.

A is (a-axis (shorter axis) lattice constant of a crystal in the powder)/(c-axis (longer axis) lattice constant of the crystal in the powder), and each of the lattice constants is obtained by X-ray diffractometry of the powder.

Requirement 2: a particle diameter D50 at a cumulative frequency of 50%, a particle diameter D10 at a cumulative frequency of 10%, and a particle diameter D90 at a cumulative frequency of 90% in a volume-based cumulative particle diameter distribution curve obtained by a laser diffraction scattering method satisfy the following conditions (I) and (II):

(I) a ratio of D10 to D50 (D10/D50) is 0.05 or more and 0.45 or less; and (II) D90 is 0.5 μm or more and 70 μm or less.

The powder may be metal oxide powder.

The metal oxide powder may be metal oxide powder containing a metal having a d electron(s).

The metal oxide powder may be titanium-containing metal oxide powder.

The titanium-containing metal oxide powder may be $TiO_x$ (x=1.30 to 1.66) powder.

The D50 may be 0.5 μm or more and 60 μm or less.

A solid composition according to the invention comprises the powder and a first material.

The first material may be at least one compound selected from the group consisting of resins, alkali metal silicates, ceramics, and metals.

Effect of the Invention

The invention can provide powder capable of forming a composition having excellent thermal expansion control characteristics and excellent coatability, and a solid composition using the powder.

BRIEF DESCRIPTION OF TEE DRAWINGS

MODE FOR CARRYING OUT THE INVENTION

Figure 1:
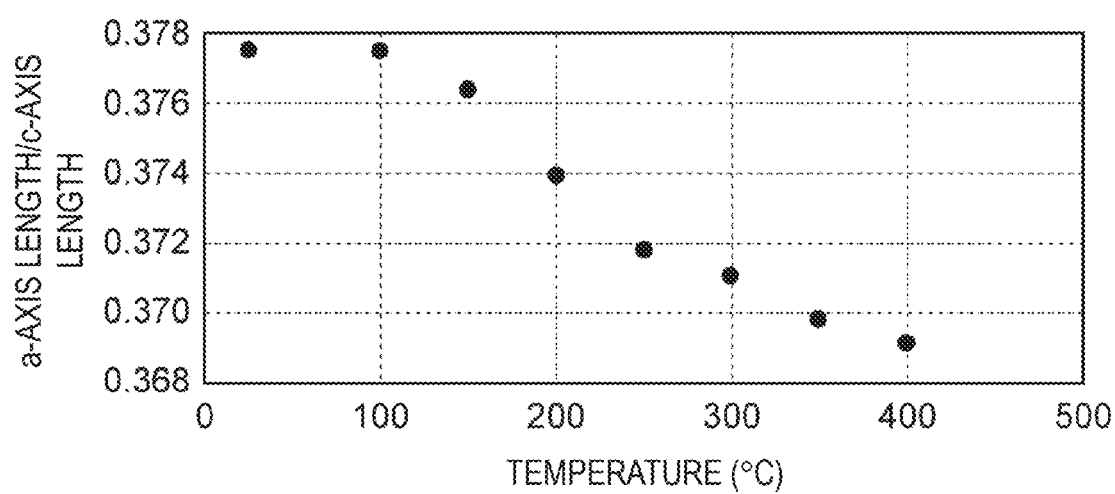
FIG. 1 is a graph showing the relationship between a temperature T and the a-axis length/c-axis length of powder in Comparative Example 1.

Hereinafter, preferable embodiments of the invention will be described in detail. However, the invention is not limited to the following embodiments.

Powder

The invention provides powder that satisfies the following requirements 1 and 2.

Requirement 1: $|dA(T)/dT|$ satisfies 10 ppm/° C. or more at at least one temperature T1 in a range of −200° C. to 1200° C.

A is (a-axis (shorter axis) lattice constant of a crystal in the powder)/(c-axis (longer axis) lattice constant of the crystal in the powder), and each of the lattice constants is obtained by X-ray diffractometry of the powder.

Requirement 2: a particle diameter D50 at a cumulative frequency of 50%, a particle diameter D10 at a cumulative frequency of 10%, and a particle diameter D90 at a cumulative frequency of 90% in a volume-based cumulative particle diameter distribution curve obtained by a laser diffraction scattering method satisfy the following conditions (I) and (II):

(I) a ratio of D10 to D50 (D10/D50) is 0.05 or more and 0.45 or less; and (II) D90 is 0.5 μm or more and 70 μm or less.

The lattice constants in the definition of A are specified by powder X-ray diffractometry. Examples of the analysis method include a Rietveld method and an analysis using fitting by a least-squares method.

As used herein, in the crystal structure specified by powder X-ray diffractometry, an axis corresponding to the smallest lattice constant is defined as a-axis, and an axis corresponding to the largest lattice constant is defined as c-axis. The length of the a-axis and the length of the c-axis of the crystal lattice are defined as an a-axis length and a c-axis length, respectively.

A(T) a parameter indicating the magnitude of anisotropy of the length of the crystal axis, and is a function of temperature T (unit: ° C.). The larger the value of A(T), the larger the a-axis length with respect to the c-axis length, and the smaller the value of A, the smaller the a-axis length with respect to the c-axis length.

Here, |dA(T)/dT| represents an absolute value of dA(T)/dT, and dA(T)/dT represents differentiation of A(T) by T (temperature).

Here, as used herein, |dA(T)/dT| is defined by the following formula:

$$|dA(T)/dT| = |A(T+50) - A(T)|/50 \quad (D).$$

As described above, it is necessary for the powder according to this embodiment to satisfy |dA(T)/dT| of 10 ppm/° C. or more at at least one temperature T1 in a range of −200° C. to 1200° C. to 1200° C. However, |dA(T)/dT| is defined within a range in which the powder exists in a solid state. Thus, the maximum temperature of T the formula (D) is up to a temperature 50° C. lower than the melting point of the powder. That is, when the restriction "at least one temperature T1 in a range of −200° C. to 1200° C." is given, the temperature range of T in formula (C) is from −200 to 1150° C.

At at least one temperature T1 in a range of −200° C. to 1200° C., |dA(T)/dT| is preferably 20 ppm/° C. or larger and more preferably 30 ppm/° C. or larger. The upper limit of |dA(T)/dT| is preferably 1000 ppm/° C. or less and more preferably 500 ppm/° C. or less.

The phenomenon where the value of |dA(T)/dT| is 10 ppm/° C. or larger at at least one temperature T1 means that the change in anisotropy of the crystal structure as accompanied by the temperature change is large.

At at least one temperature T1, dA(T)/dT may be positive or negative, but is preferably negative.

Depending on the type of crystal in the powder, there is a material, the crystal structure of which changes due to a structural phase transition in a certain temperature range. As used herein, in the crystal structure at a certain temperature, an axis having the largest crystal lattice constant is defined as c-axis, and an axis having the smallest crystal lattice constant is defined as a-axis. In any of the triclinic, monoclinic, orthorhombic, tetragonal, hexagonal, and rhombohedral crystal systems, the a-axis and the c-axis are defined as described above.

A procedure for measuring a volume-based cumulative particle diameter distribution curve by a laser diffraction scattering method will be described below.

As pretreatment, 99 parts by weight of water is added to 1 part by weight of the powder for dilution, and the mixture is subjected to ultrasonic treatment by using an ultrasonic cleaner. The ultrasonic treatment time is 10 min. The ultrasonic cleaner used may be an NS200-6U, manufactured by NISSEI Corporation. The frequency of the ultrasonic wave is about 28 kHz.

For the measurement, a volume-based particle diameter distribution is measured by a lager diffraction scattering method. For example, a laser diffraction particle diameter distribution analyzer Mastersizer 2000, manufactured by Malvern Instruments Ltd., can be used.

When the powder is $Ti_2O_3$ powder, the refractive index of $Ti_2O_3$ particles can be set to 2.40 for measurement.

As used herein, in the volume-based cumulative particle diameter distribution curve, the cumulative frequency is calculated from the smallest particle diameter. Then, the particle diameter at which the cumulative frequency is 10% is defined as D10, the particle diameter at which the cumulative frequency is 50% is defined as D50, and the particle diameter at which the cumulative frequency is 90% is defined as D90.

As described above, in the powder according to this embodiment, the D10/D50 needs to be 0.05 or more and 0.45 or less. D10/D50 is preferably 0.10 or larger and more preferably 0.20 or larger. D10/D50 is preferably 0.44 or less and more preferably 0.43 or less. If D10/D50 is in such a range, the thermal expansion suppression characteristics are improved. If D10/D50 is 0.05 or larger, homogeneity and dispersbility at the time of mixing with a matrix material such as a resin is easily maintained.

It is considered that the smaller the D10/D50, the larger the variation in the particle diameter of the powder, and the larger the D10/D50, the smaller the variation in the particle diameter of the powder. The present inventors presume that such a combination of the variation and the value of D90 affects the characteristic of controlling the linear thermal expansion coefficient.

As described above, in the powder according to this embodiment, D90 needs to be 0.5 μm or more and 70 μm or less. D90 is preferably 0.6 μm or larger and more preferably 0.7 μm or larger. D90 is preferably 60 μm or less and more preferably 40 μm or less. If D90 is in such a range, the coatability is improved. If D90 is 0.5 μm or larger, aggregated particles are unlikely to occur. Also, homogeneity at the time of kneading with a matrix material such as a resin is easily improved.

D50 is preferably 0.5 μm or more and 60 μm or less. If D50 is 60 μm or less, the coatability tends to be improved easily. If D50 is 0.5 μm or larger, aggregated particles are unlikely to occur. Also, homogeneity at the time of kneading with a matrix material such as a resin is easily improved. The D50 is more preferably 40 μm or less, still more preferably 30 μm or less, and particularly preferably 20 μm or less.

The BET specific surface area of the powder according to this embodiment is preferably 0.1 $m^2/g$ or more and 5.0 $m^2/g$ or less, more preferably 0.2 $m^2/g$ or more and 4.5 $m^2/g$ or less, and still more preferably 0.22 $m^2/g$ or more and 3.0 $m^2/g$ or less. If the BET specific surface area of the powder is in such a range, homogeneity and dispersibility at the time of mixing with a matrix material such as resin is easily maintained.

A procedure for measuring the BET specific surface area is shown below.

As pretreatment, drying is performed at 200° C. for 30 min in a nitrogen atmosphere, and then measurement is carried out. The measurement method used is a BET flow method. As measurement conditions, a mixed gas of nitrogen gas and helium gas is used. The percentage of the nitrogen gas in the mixed gas is set to 30 vol %, and the percentage of the helium gas in the mixed gas is set to 70 vol %. The measuring apparatus used may be, for example, a BET specific surface area measuring apparatus Macsorb HM-1201 (manufactured by MOUNTECH Co., Ltd.).

The powder is preferably oxide powder. In particular, the powder is more preferably metal oxide powder. The metal oxide powder may contain plurality of metals.

The metal oxide powder is not particularly limited, and is preferably metal oxide powder containing a metal having d electrons, and more preferably metal oxide powder containing a metal having only 3d electrons among d electrons.

The metal oxide powder containing a metal having d electrons is not particularly limited, and examples thereof include metal oxide powder containing Sc, Ti, V, Cr, Mn, Fe, Co, Ni, Cu, Y, Zr, Nb, and/or Mo.

Examples of the metal oxide powder containing a metal having only 3d electrons among d electrons include metal oxide powder containing Sc, Ti, V, Cr, Mn, Fe, Co, Ni, and/or Cu. Among them, titanium-containing metal oxide powder is preferable from the viewpoint of resource availability.

More specifically, the titanium-containing metal oxide powder is preferably powder represented by a composition formula $TiO_x$ (x=1.30 to 1.66), and more preferably powder represented by a composition formula $TiO_x$ (x=1.40 to 1.60). In $TiO_x$, some of Ti atoms may be substituted with other elements.

Note that the titanium-containing metal oxide powder may be oxide powder containing titanium and a metal atom(s) other than titanium, such as $LaTiO_3$, in addition to the $TiO_x$ powder.

The crystal structure of each particle constituting the powder preferably has a perovskite structure or a corundum structure, and more preferably has a corundum structure.

The crystal system is not particularly limited, and is preferably a rhombohedral crystal system. The space group is preferably assigned to be R-3c.

When the powder is metal oxide powder, $|dA(T)/dT|$ at −200° C. to 1200° C. is 10 ppm/° C. or more at at least one temperature.

When the powder is metal oxide powder containing a metal having d electrons, $|dA(T)/dT|$ at −100° C. to 1000° C. is preferably 10 ppm/° C. or more at at least one temperature.

When the powder is metal oxide powder containing a metal having only 3d electrons among d electrons, $|dA(T)/dT|$ at −100° C. to 800° C. is preferably 10 ppm/° C. or more at at least one temperature.

When the powder is $TiO_x$ (x=1.30 to 1.66), $|dA(T)/dT|$ at 0° C. to 500° C. is preferably 10 ppm/° C. or more at at least one temperature.

<Solid Composition>

The solid composition according to this embodiment contains the powder according to this embodiment and a first material.

[First Material]

The first material is not particularly limited, and examples thereof include a resin, an alkali metal silicate, a ceramic, or a metal. The first material may be a binder material that bonds the powder bodies or a matrix material that holds the powder in a dispersed state.

Examples of the resin include a thermoplastic resin or a thermosetting resin.

Examples of the thermosetting resin include an epoxy resin, an oxetane resin, an unsaturated polyester resin, an alkyd resin, a phenol resin (e.g., a novolac resin, a resol resin), an acrylic resin, a urethane resin, a silicone resin, a polyimide resin, or a melamine resin.

Examples of the thermoplastic resin include polyolefin (e.g., polyethylene, polypropylene), ABS resin, polyamide (e.g., nylon 6, nylon 6,6), polyamideimde, polyester (polyethylene terephthalate, polyethylene naphthalate), liquid crystalline resin, polyphenylene ether, polyacetal, polycarbonate, polyphenylene sulfide, polyimide, polyetherimide, polyethersulfone, polyketone, polystyrene, or polyetheretherketone.

The first material optionally contains one kind or two or more kinds of the above resin.

From the viewpoint of being able to enhance heat resistance, the first material is preferably an epoxy resin, polyether sulfone, a liquid crystal polymer, polyimide, polyamideimide, or silicone.

Examples of the alkali metal silicate include lithium silicate, sodium silicate, or potassium silicate. The first material may contain one kind or two or more kinds of alkali metal silicate. These materials are preferable because of increased heat resistance.

Examples of the ceramic include, but are not particularly limited to, an oxide-based ceramic (e.g., alumina, silica (including silicon oxide or silica glass), titania, zirconia, magnesia, ceria, yttria, zinc oxide, iron oxide); a nitride-based ceramic (e.g., silicon nitride, titanium nitride, boron nitride); or silicon carbide, calcium carbonate, aluminum sulfate, barium sulfate, aluminum hydroxide, potassium titanate, talc, kaolin clay, kaolinite, halloysite, pyrophyllite, montmorillonite, sericite, mica, amesite, bentonite, asbestos, zeolite, calcium silicate, magnesium silicate, diatomaceous earth, or silica sand. The first material may contain one kind or two or more kinds of the ceramic.

The ceramic is preferable because the heat resistance can be increased. A sintered body may be produced by, for example, spark plasma sintering.

Examples of the metal include, but are not particularly limited to, a simple metal (e.g., aluminum, tantalum, niobium, titanium, molybdenum, iron, nickel, cobalt, chromium, copper, silver, gold, platinum, lead, tin, tungsten), an alloy (e.g., stainless steel (SUS)), or a mixture thereof. The first material may contain one kind or two or more kinds of the metal. Such a metal is preferable because the heat resistance can be increased.

[Additional Components]

The solid composition of this embodiment may contain an additional component (a) other than the first material and the powder. Examples thereof include a catalyst. Examples of the catalyst include, but are not particularly limited to, an acidic compound, an alkaline compound, or an organometallic compound. The acidic compound used may be an acid such as hydrochloric acid, sulfuric acid, nitric acid, phosphoric acid, phosphoric acid, formic acid, acetic acid, or oxalic acid. The alkaline compound used may be, for example, ammonium hydroxide, tetramethylammonium hydroxide, or tetraethylammonium hydroxide. Examples of the organometallic compound catalyst include those containing aluminum, zirconium, tin, titanium, and/or zinc.

The content of the powder in the solid composition may be, for example, 1% by weight or more. The content of the powder in the solid composition may be 3% by weight or more, 5% by weight or more, 10% by weight or more, 20% by weight or more, 40% by weight or more, or 70% by weight or more. The content of the powder in the solid composition can be, for example, 99 wt % or less. The content of the powder in the solid composition may be 95 or less or 90 wt % or less. When the content of the powder is in such a range, the effect of decreasing the linear thermal expansion coefficient easily exerted.

The content of the first material in the solid composition can be, for example, 1% by weight or more. The content of the first material in the solid composition may be 5 wt % or more or 10 wt % or more. The content of the first material in the solid composition can be, for example, 99 wt % or less. The content of the first material in the solid composition may be 97 wt % or less, 95 wt % or less, 90 wt % or less, 80 wt % or less, 60 wt % or less, or 30 wt % or less.

The present inventors have found that when the requirement 1 is satisfied, that is, in the powder in which the size of the crystal lattice is largely anisotropically changed in response to the temperature change, and the requirement 2 is satisfied, both the thermal expansion control characteristics and the coatability can be achieved.

According to the powder of this embodiment, the linear thermal expansion coefficient of the solid composition using the powder can be sufficiently lowered. The powder of this embodiment can be used to form an ink composition with excellent coatability. The solid composition formed from the ink composition using the powder of this embodiment has a sufficiently low linear thermal expansion coefficient, and has reduced defects, such as blur, caused by coating.

The powder according to this embodiment may be included in the solid composition of this embodiment to provide a sufficiently low linear thermal expansion coefficient and to reduce defects caused by coating.

The powder and the solid composition according to this embodiment may be used to obtain a member having a very small dimensional change when the temperature changes. Thus, they can be suitably used for an optical member or a semiconductor manufacturing equipment member that is particularly sensitive to a temperature-dependent dimensional change.

In addition, the powder and the solid composition according to this embodiment may be used to obtain a solid material having a negative linear thermal expansion coefficient. Having a negative linear thermal expansion coefficient means that the volume shrinks with the linear thermal expansion. A plate may be obtained by bonding an end surface (side surface) of a plate made of a solid composition having a negative linear thermal expansion coefficient to an end surface of a plate made of another material having a positive linear thermal expansion coefficient. In this plate, it is possible to make substantially zero the linear thermal expansion coefficient in a direction perpendicular to the thickness direction of the whole plate.

<Process for Producing Powder>

The process for producing powder according to this embodiment is not particularly limited, and for example, the powder can be produced by preparing raw material powder by treatment such as sintering and then adjusting the particle diameter distribution of the resulting powder.

The powder particle diameter distribution can be adjusted by, for example, operation such as sieving or pulverization. The following describes an example of the pulverization step when the raw material powder is pulverized to adjust the particle diameter distribution.

[Pulverization Step]

The pulverization step can be a step of pulverizing the raw material powder by using, for instance, a ball mill, a planetary ball mill, or a bead mill.

In the pulverizing step, for example, the powder is pulverized with beads while using a medium stirring type pulverize including a pulverization container and a rotating body. The powder is preferably pulverized in the presence of a dispersion medium. By using the dispersion medium, the particle surface of the powder can be wetted to weaken the interaction between the particles. This makes it possible to suppress aggregation of the powder and adhesion of the powder to the pulverization container, the beads, or the rotating body.

The rotating body is a part configured to directly transmit kinetic energy to the beads by rotational motion. In the medium stirring type mill such as a bead mill or an attritor, the rotating body is a stirring blade including a shaft and an arm. In a rotary cylindrical ball mill, such as a ball mill, in which a pulverization container itself rotates and/or revolves to cause content powder and beads to flow, the rotating body is a pulverization container.

In one embodiment, the rotating body is a stirring blade.

The beads are a pulverizing medium for pulverizing the powder. A pulverizing medium having a large average particle diameter may be referred to as a ball. However, as used herein, a solid pulverizing medium is referred to as a bead regardless of the average particle diameter. The beads flow at a high speed in the pulverization, container and collide with the powder by rotation of the pulverization container itself of the pulverizer or rotation of the shaft with an arm. As a result, the powder is crushed to give powder having a smaller average particle diameter.

The shape of each bead is preferably spherical or ellipsoidal from the viewpoint of reducing contamination of impurities due to abrasion of the beads.

The diameter of the beads is preferably larger than the average particle diameter of the pulverized powder. By using such beads, large pulverization energy can be applied to the powder. Accordingly, it is considered that powder of interest can be efficiently obtained in a short time. Here, the diameter of each bead refers to the average particle diameter of the beads.

The diameter of each bead is, for example, from 0.03 mm to 2 mm. It is considered that when the bead diameter is within this range, the value of D90 can be effectively lowered and the coatability is easily improved. The diameter of each bead placed in the pulverization container may be uniform or may be different.

Examples of a material for the beads include glass, agate, alumina, zirconia, stainless steel, chrome steel, tungsten carbide, silicon carbide, or silicon nitride. The beads made of such a material may be used to efficiently pulverize the powder. Among them, zirconia is preferable because it has relatively high hardness and thus is less likely to be worn, and since the specific gravity is relatively large, large pulverization energy can be given.

In the pulverization step, the ratio of the mass of the powder to the mass of the beads ((mass of powder)/(mass of beads)) is not particularly limited, and can be set to, for example, 0.02 to 0.10. The ratio of the mass of the powder to the mass of the beads is preferably from 0.02 to 0.09 and more preferably from 0.02 to 0.06. When the ratio of the mass of the powder to the mass of the beads is in this range, it is considered that the value of D90 can be effectively lowered.

The peripheral speed of the rotating body is not particularly limited, and is generally from 0.5 to 10 m/s.

The packing ratio of the beads is preferably 10 vol. % or more and 74 vol % or less based on the volume of the pulverization container provided in the medium stirring type pulverizer.

In the case of using a dispersion medium, for example, a liquid dispersion medium such as water or an organic solvent may be used. The organic solvent may optionally contain water. Examples of the organic solvent include an alcohol solvent, an ether solvent, a ketone solvent, a glycol solvent, a hydrocarbon-based solvent, or an aprotic polar solvent.

The pulverization time is preferably from 0.01 h to 10 h, more preferably from 0.01 h to 5 h, and still more preferably from 0.01 h to 2 h from the viewpoint of suppressing re-aggregation of the powder.

The pulverization time may be, for example, from 0.1 to 1 h or from 0.1 to 0.5 h from the viewpoint of easily obtaining powder satisfying the above requirement 2.

The powder particle diameter distribution can be controlled by chasing the pulverization time. For example, the linear thermal expansion coefficient of a composition prepared using the powder may be controlled in the order of −40 ppm/° C. to 0 ppm/° C. finely adjusting the particle diameter distribution by changing the pulverization time in the range of 0.17 h to 1 h.

The powder particle diameter distribution can also be adjusted by changing the rotational speed. For example, by controlling the rotation number in the range of 100 rpm to 1500 rpm and finely adjusting the particle diameter distribution, the linear thermal expansion coefficient of a composition prepared using the powder may be controlled in the order of −40 ppm/° C. to 0 ppm/° C., Since heat is generated along with the pulverization, it is preferable to cool the pulverization container so as to maintain the inside of the pulverization container in a certain temperature range during operation of the pulverizer.

In the wet pulverization using a dispersion medium, the temperature in the pulverization container is preferably sufficiently higher than the melting point of the dispersion medium and sufficiently lower than the boiling point of the dispersion medium.

In the pulverizing step, the temperature in the pulverization container is preferably from 0° C. to 100° C. and more preferably from 5° C. to 50° C.

After the pulverization step, the beads are separated from the powder and the dispersion medium by using, for example, a filter.

<Method for Producing Solid Composition>

The method for producing the solid composition is not particularly limited.

For example, the powder and a raw material for the first material may be mixed to prepare a mixture. Next, the raw material for the first material in the mixture may be converted into the first material. This can produce a solid composition in which the powder and the first material are composited.

For example, the first material may be a resin or an alkali metal silicate. In this case, a solvent, the resin or alkali metal silicate, and the powder may be included to prepare a mixture. The solvent may then be removed from the mixture. This can produce a solid composition containing the powder and the first material. As the procedure for removing the solvent, it is possible to apply a procedure in which the solvent is evaporated by, for example, natural diving, vacuum drying, or heating. From the viewpoint of suppressing generation of coarse foams, it is preferable to remove the solvent while maintaining the temperature of the mixture at a temperature equal to or lower than the boiling point of the solvent during removal of the solvent.

When the first material is a resin, the solvent is, for example, an organic solvent (e.g., an alcohol solvent, an ether solvent, a ketone solvent, a glycol solvent, a hydrocarbon solvent, or an aprotic polar solvent) or water. The solvent in the case of the alkali metal silicate is, for example, water.

In addition, when the resin is a curable resin, it is preferable to crosslink the resin in the mixture after removal of the solvent. Specifically, the mixture from which the solvent has been removed may be heated to a temperature equal to or higher than the boiling point of the solvent, or the mixture from which the solvent has been removed may be irradiated with energy rays such as ultraviolet rays. In addition, in the case of an alkali metal silicate, the curing treatment may be performed by further heating after removal of the solvent.

Further, the first material may be a ceramic or a metal. In this case, a mixture of the powder and raw material powder for the first material may be prepared. Next, the mixture is heated so as to sinter the raw material powder for the first material. This can produce a solid composition containing the first material as a sintered body and the powder. If necessary, pores of the solid composition can be adjusted by heat treatment such as annealing. As the sintering procedure, a procedure such as regular heating, hot pressing, or spark plasma sintering can be employed.

In the spark plasma sintering, a pulsed current is applied to a mixture of the powder and raw material powder for the first material while the mixture is pressurized. As a result, electric discharge occurs between the raw material powder molecules of the first material, and the raw material powder for the first material can thus be heated and sintered.

The plasma sintering step is preferably performed under an inert (e.g., argon, nitrogen, or vacuum) atmosphere in order to prevent the resulting compound from being altered by contact with the air.

The pressure applied in the plasma sintering step is preferably in a range of more than 0 MPa and 100 MPa or less. To obtain a high-density first material, the pressure applied in the plasma sintering step is preferably 10 MPa or higher and more preferably 30 MPa or higher.

The heating temperature in the plasma sintering step is preferably sufficiently lower than the melting point of the first material of interest.

Note that when the mixture is applied onto a substrate and the solvent is then removed or sintering is performed, a sheet-shaped solid composition can be obtained. In addition, when the mixture is supplied into a mold and the solvent is then removed/sintering is performed, a solid composition having any shape corresponding to the shape of the mold can be obtained.

Furthermore, the size and distribution of pores can be adjusted by heating the solid composition obtained.

EXAMPLES

Hereinafter, the invention will be described in more detail with reference to Examples.

<To Analyze Crystal Structure of Powder>

The crystal structure was analyzed using a powder X-ray diffractometer SmartLab (manufactured by Rigaku Corporation) under the conditions below. Powder was subjected to powder X-ray diffractometry while the temperature was changed to obtain a powder X-ray diffraction pattern. Based on the obtained pattern, lattice constants were refined by the least-squares method using PDXL2 (manufactured by Rigaku Corporation) software. Then, two lattice constants, namely the a-axis length and the c-axis length were determined.

Measuring apparatus: powder X-ray diffractometer SmartLab (manufactured by Rigaku)

X-ray generator: CuKα radiation source with a voltage of 45 kV and a current of 200 mA Slit: slit width of 2 mm Scan step: 0.02 deg Scan range: 5 to 80 deg Scan speed: 10 deg man X-ray detector: one-dimensional semiconductor detector Measurement atmosphere: Ar at 100 mL/min Sample stage: dedicated glass substrate made of $SiO_2$

[Temperature Dependent Change of a-Axis Length and c-Axis Length]

The powder of Comparative Example 1 was subjected to X-ray diffractometry at 25° C., 100° C., 150° C., 200° C., 250° C., 300° C., 350° C., and 400° C., As a result, the powder of Comparative Example 1 was assigned to $Ti_2O_3$ having a corundum structure, and the space group was R-3c. The a-axis length, the c-axis length, and the ratio (a-axis length/c-axis length) of the a-axis length to the c-axis length at each temperature are collectively provided in Table 1. The relationship between the a-axis length/the c-axis length and the temperature T, that is, A(T) is depicted in FIG. 1.

TABLE 1

| Temperature (° C.) | c-axis length (Å) | a-axis length (Å) | a-axis length/c-axis length |
|---|---|---|---|
| 25 | 13.645 | 5.151 | 0.378 |
| 100 | 13.647 | 5.151 | 0.377 |
| 150 | 13.677 | 5.148 | 0.376 |
| 200 | 13.737 | 5.137 | 0.374 |
| 250 | 13.802 | 5.132 | 0.372 |
| 300 | 13.816 | 5.127 | 0.371 |
| 350 | 13.857 | 5.125 | 0.370 |
| 400 | 13.877 | 5.123 | 0.369 |

Using the obtained a-axis length and c-axis length, |dA(T)/dT| at T1=150° C. was calculated using formula (D) below, and the result was 49 ppm/° C., Note that dA(T)/dT was negative.

$$|dA(T)/dT|=|A(T+50)-A(T)|/50 \quad (D).$$

The powder of each of Examples 1 to 3 was subjected to X-ray diffractometry at 150° C. and 200, and dA(T)/dT at T1=150° C. was calculated from the values for the lattice constants.

dA(t)/dT=(A(T+50)−A(T))/50 at T1=150° C. in Example 1 was −44 ppm/° C. In addition, at T1−150° C., |dA(T)/dT| was 44 ppm/° c.

dA(T)/dT=(A(T+50)−A(T))/50 at T1=150° C. in Example 2 was −42 ppm/° C. In addition, at T1=150° C., |dA(T)/dT| was 42 ppm/° C.

dA(T)/dT=(A(T+50)−A(T))/50 at T1=150° C. in Example 3 was −45 ppm/° C. In addition, at T1=150° C., |dA(T)/dT| was 45 ppm/° C.

From the results of Example 1 to 3 and Comparative Example 1, it can be estimated that the a-axis length and the c-axis length do not change significantly in the pulverization described later. From this, it is presumed that dA(T)/dT=(A(T+50)−A(T))/50 of the powder of Comparative Example 2 at T1=150° C. is negative, and |dA(T)/dT| is at least 10 ppm/° C. or more.

The powder of any of Examples 1 to 3 or Comparative Example 2 was assigned to $Ti_2O_3$ having a corundum structure, and the space group was R-3c.

<To Measure Powder Particle Diameter Distribution>

The particle diameter distribution was measured by the following protocol.

Pretreatment: 1 part by weight of each powder was diluted by adding 99 parts by weight of water, and the mixture was subjected to ultrasonic treatment with an ultrasonic cleaner. The ultrasonic treatment time was set to 10 min, and an NS200-6U, manufactured by NISSEI Corporation, was used as the ultrasonic cleaner. The frequency of the ultrasonic wave was about 28 kHz.

Measurement: the volume-based particle diameter distribution was measured by a laser diffraction scattering method.

Measurement conditions: the refractive index of $Ti_2O_3$ particles was set to 2.40.

Measuring apparatus: laser diffraction particle diameter distribution analyzer Mastersizer 2000, manufactured by Malvern Instruments Ltd.

From the volume-based cumulative particle diameter distribution curve thus obtained, the particle diameter D50 at which the cumulative frequency was 50%, the particle diameter D10 at which the cumulative frequency was 10%, and the particle diameter D90 at which the cumulative frequency was 90%, as calculated from the smallest particle diameter, were calculated. In addition, the D10 and D50 were used to calculate the ratio of D10 to D50 (D10/D50).

<To Measure BET Specific Surface Area>

The BET specific surface area was measured by the following protocol.

Pretreatment: drying was performed at 200° C. for 30 min in a nitrogen atmosphere.

Measurement: measured by a BET flow method.

Measurement conditions: a mixed gas of nitrogen gas and helium gas was used. The percentage of nitrogen gas in the mixed gas was 30 vol %, and the percentage of helium gas in the mixed gas was 70 vol %.

Measuring apparatus: BET specific: surface area measuring apparatus Macsorb HM-1201 (manufactured by MOUNTECH Co., Ltd.)

<To Evaluate Thermal Expansion Control Characteristics>

The thermal expansion control characteristics were evaluated by the following protocol.

80 parts by weight of each powder, 20 parts by weight of No. 1 sodium silicate, manufactured by Fuji Chemical Co., Ltd., and 10 parts by weight of pure water were added and mixed to prepare a mixture.

The resulting mixture was placed in a mold made of polytetrafluoroethylene and cured with the following curing profile.

The temperature was raised to 80° C. in 15 min, held at 80° C. for 20 min, then raised to 150° C. in 20 min, and held at 150° C. for 60 min.

Further, the temperature was raised to 320° C., held for 10 min, and the temperature was then lowered. The above steps were performed to produce a solid composition.

The linear thermal expansion coefficient of the resulting solid composition was measured using the following apparatus.

Measuring apparatus: Thermo plus EVO2 TMA series Thermo plus 3310

The temperature region was set to be from 25° C. to 320° C., and the value for the linear thermal expansion coefficient at 190-210° C. was calculated as a representative value.

Reference solid: alumina

The typical size of a measurement sample of the solid composition was 15 mm×4 mm×4 mm.

For a solid composition of 15 mm×4 mm×4 mm, the longest side was set as the sample length. L, and the sample length L (T) at the temperature T was measured. The dimensional change with respect to the sample length (L(30° C.)) at 30° C., that is, ΔL(T)/L(30° C.) was calculated by the following formula:

$$\Delta L(T)/L(30°\,C.)=(L(T)-L(30°\,C.))/L(30°\,C.).$$

The dimensional change ΔL(T)/L(30° C.) was determined in a temperature range of 190° C. to 210° C., and the linear thermal expansion coefficient α (1/° C.) at 190° C.-210° C. was calculated by the following formula:

$$\alpha(1/°\,C.)=(\Delta L(210°\,C.)-\Delta L(190°\,C.))/(L(30°\,C.)\times 20°\,C.$$

When the value for the linear thermal expansion coefficient was 6.0 ppm/° C. or less, the thermal expansion control characteristics were evaluated to be favorable.

<To Evaluate Coatability>

Figure 2:
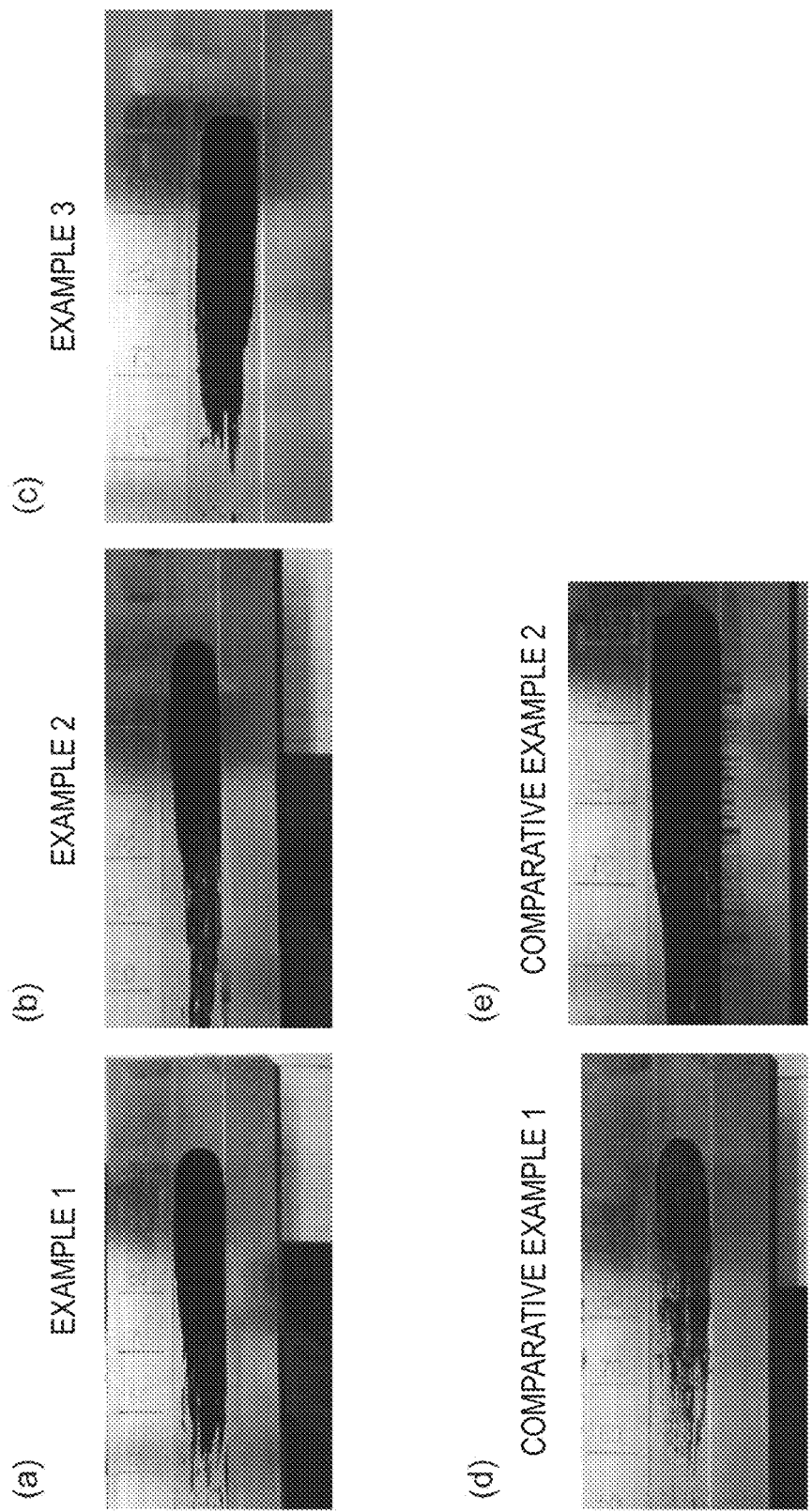
FIG. 2 is photos involving evaluation of coatability in Examples 1 to 3 and Comparative Examples 1 to 2.

The coatability was evaluated by the following protocol. 50 parts by weight of No, 1 sodium silicate, manufactured by Fuji Chemical Co., Ltd., was added to 50 parts by weight of each powder to prepare a mixture. The resulting mixture was applied to a substrate by using a particle gauge (manufactured by Nihon Sidars Services, Inc.) having a depth of 100 μm. The state after coating was visually checked. Then, a sample without any blur in the range of 80 to 100 μm at the gauge scale was graded as "A", and a sample with blur in the range of 80 to 100 μm at the gauge scale was graded as "B". The state after coating is shown in FIG. 2.

Example 1

$Ti_2O_3$ powder (150 μm pass, purity 99.9%, manufactured by Kojundo Chemical Lab. Co., Ltd.) was pulverized with a bead mill under conditions below to obtain powder.

Figure 3:
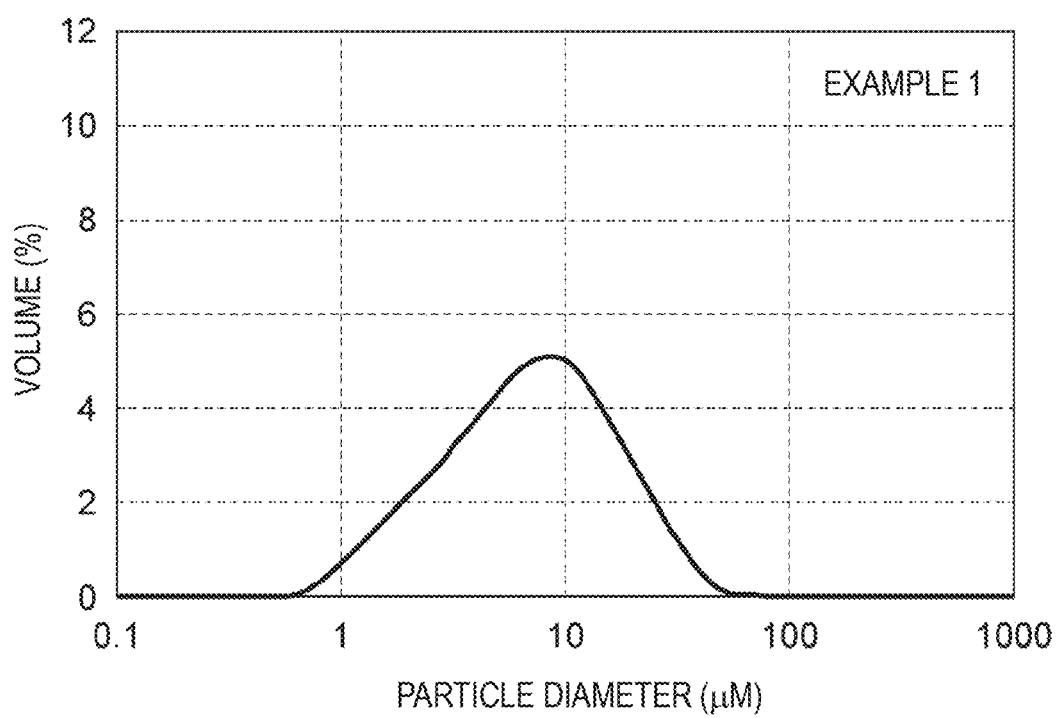
FIG. 3 is a graph showing the powder particle diameter distribution in Example 1.

Pulverization conditions: a batch-type ready mill (RM B-08), manufactured by AIMEX CO., LTD., was used as a bead mill. Pulverization was performed using a 800-cm³ vessel under conditions at 1348 rpm and a peripheral speed of 5 m/s, $ZrO_2$ beads having a particle diameter of 1 mm were used, and 217 g of water, 613 g of $ZrO_2$, and $Ti_2O_3$ (150 μm pass, 24.9 g, manufactured by Kojundo Chemical Lab. Co., Ltd.) were mixed and pulverized for 10 min. The particle diameter distribution of the resulting powder is shown in FIG. 3. The volume-based cumulative particle diameter distribution curve can be obtained by converting the particle diameter distribution shown in FIG. 3 cumulative particle diameter distribution curve.

Example 2

Powder of Example 2 was prepared by the same procedure as Example 1 except that the pulverization time was 20 min.

Example 3

Figure 4:
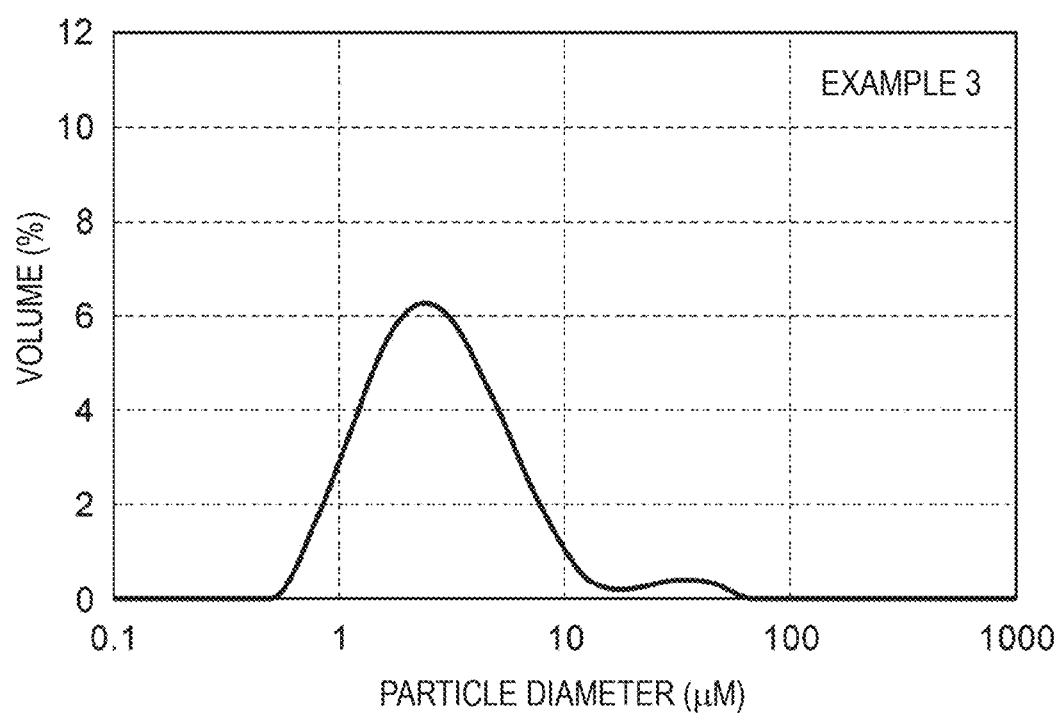
FIG. 4 is a graph showing the powder particle diameter distribution in Example 3.

Powder of Example 3 was prepared in the same manner as in Example 1 except that the pulverization time was 40 min. The particle diameter distribution of the resulting powder is shown in FIG. 4. The volume-based cumulative particle diameter distribution curve can be obtained by converting the particle diameter distribution shown in FIG. 4 into a cumulative particle diameter distribution curve.

Comparative Example 1

Figure 5:
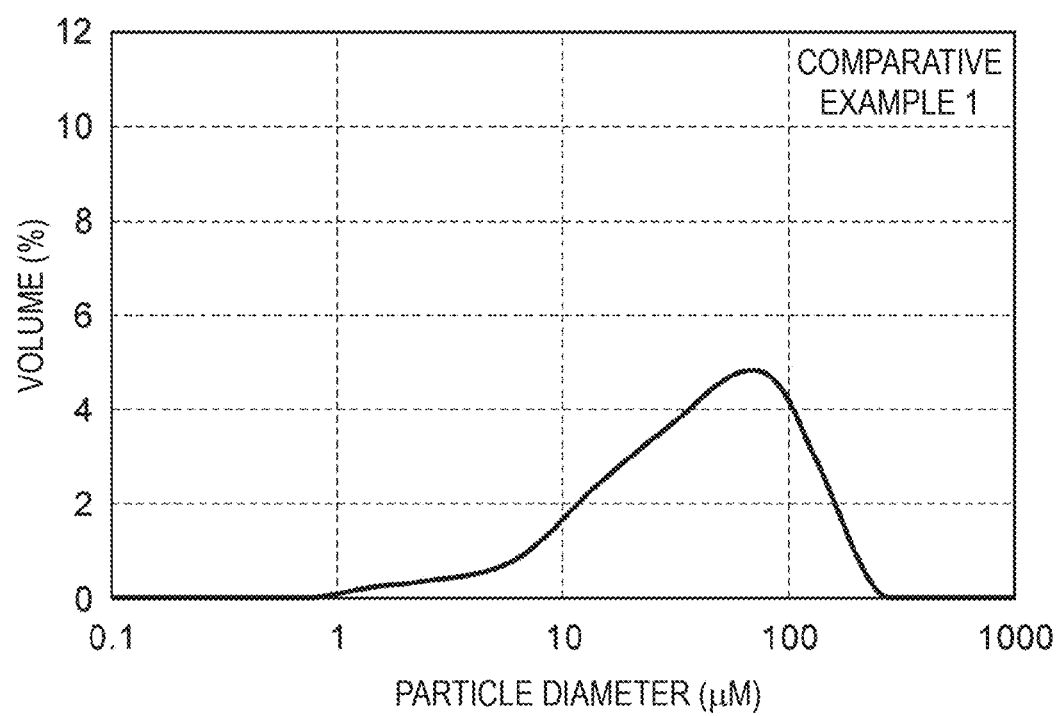
FIG. 5 is a graph showing the powder particle diameter distribution in Comparative Example 1.

$Ti_2O_3$ powder (150 μm pass, purity 99.9%, manufactured by Kojundo Chemical Lab. Co., Ltd.) was used as powder of Comparative Example 1. The particle diameter distribution of the resulting powder is shown in FIG. 5. The volume-based cumulative particle diameter distribution curve can be obtained by converting the particle diameter distribution shown in FIG. 5 into a cumulative particle diameter distribution curve.

Comparative Example 2

Figure 6:
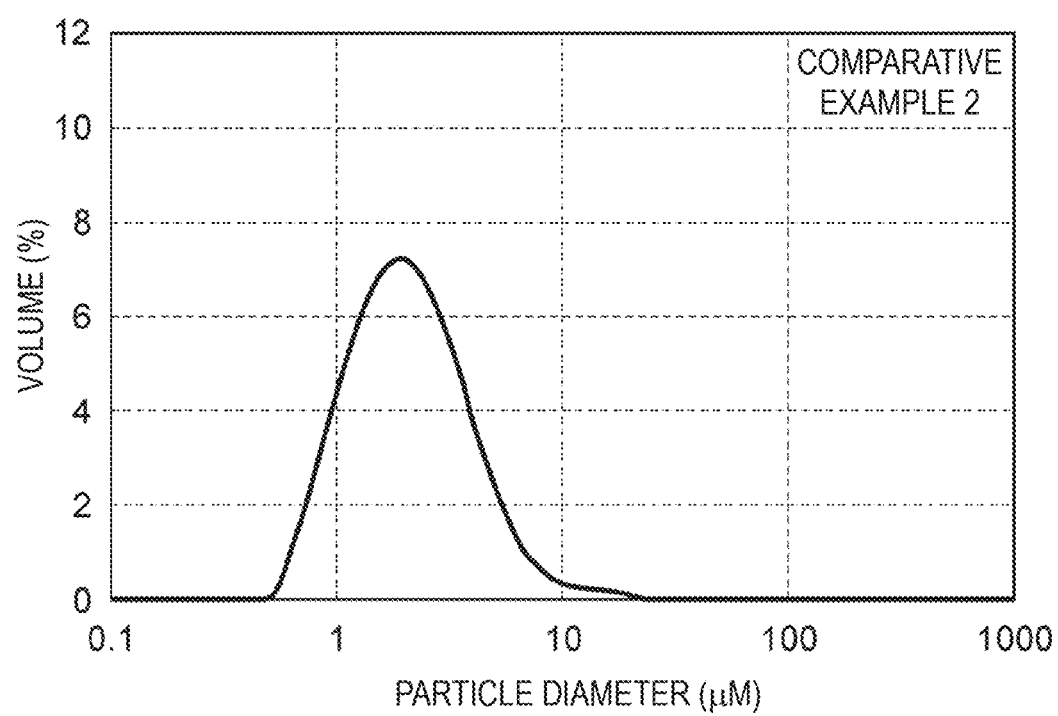
FIG. 6 is a graph showing the powder particle diameter distribution in Comparative Example 2.

Powder of Comparative Example 2 was prepared in the same manner as in Example 1 except that the pulverization time was 60 min. The particle diameter distribution of the resulting powder is shown in FIG. 6. The volume-based cumulative particle diameter distribution curve can be obtained by converting the particle diameter distribution shown in FIG. 6 into a cumulative particle diameter distribution curve.

The obtained results of the Examples and Comparative Examples are collectively provided in Table 2.

TABLE 2

|  | $\|dA(T)/dT\|$ (ppm/° C.) at T1 = 150° C. | D90 (μm) | D50 (μm) | Coatability | D10/D50 | Linear thermal expansion coefficient (ppm/° C.) at 190-210° C. | BET specific surface area (m²/g) |
| --- | --- | --- | --- | --- | --- | --- | --- |
| Example 1 | 44 | 19.2 | 6.7 | A | 0.282 | −3.6 | 1.81 |
| Example 2 | 42 | 18.9 | 4.4 | A | 0.336 | 1.5 | 2.71 |
| Example 3 | 45 | 6.8 | 2.5 | A | 0.427 | 5.2 | 4.32 |
| Comparative Example 1 | 49 | 115.6 | 41.3 | B | 0.211 | — | 0.27 |
| Comparative Example 2 | — | 4.4 | 1.9 | A | 0.474 | 6.7 | 5.10 |

It has been demonstrated that the powder of each Example can be used to form a composition having excellent thermal expansion control characteristics and excellent coatability.

The invention claimed is:
1. A titanium-containing metal oxide powder that satisfies the following requirements 1 and 2:
   requirement 1: $|dA(T)/dT|$ satisfies 10 ppm/° C. or more at at least one temperature T1 in a range of −200° C. to 1200° C.
   where A is (a-axis (shorter axis) lattice constant of a crystal in the powder)/(c-axis (longer axis) lattice con- stant of the crystal in the powder), and each of the lattice constants is obtained by X-ray diffractometry of the powder;

dA(T)/dT represents differentiation of A(T) by T (temperature), |dA(T)/dT| represents an absolute value of dA(T)/dT, and |dA(T)/dT|=|A(T+50)−A(T)|/50;

requirement 2: a particle diameter D50 at a cumulative frequency of 50%, a particle diameter D10 at a cumulative frequency of 10%, and a particle diameter D90 at a cumulative frequency of 90% in a volume-based cumulative particle diameter distribution curve obtained by a laser diffraction scattering method satisfy the following conditions (I) and (II):

(I) a ratio of D10 to D50 (D10/D50) is 0.05 or more and 0.45 or less, and (II) D90 is 0.5 μm or more and 70 μm or less.

2. The titanium-containing metal oxide powder according to claim 1, wherein the titanium-containing metal oxide powder is $TiO_x$ (x=1.30 to 1.66) powder.

3. The titanium-containing metal oxide powder according to claim 1, wherein the D50 is 0.5 μm or more and 60 μm or less.

4. A solid composition comprising the titanium-containing metal oxide powder according to claim 1 and a first material.

5. The solid composition according to claim 4, wherein the first material is at least one compound selected from the group consisting of resins, alkali metal silicates, ceramics, and metals.

* * * * *